United States Patent
Makino et al.

(10) Patent No.: US 7,495,880 B2
(45) Date of Patent: Feb. 24, 2009

(54) CIRCUIT BOARD AND ELECTRIC DEVICE HAVING CIRCUIT BOARD

(75) Inventors: Akinobu Makino, Hoi-gun (JP); Tsuneo Watanabe, Nagoya (JP)

(73) Assignee: DENSO Corporation, Kariya (JP)

( * ) Notice: Subject to any disclaimer, the term of this patent is extended or adjusted under 35 U.S.C. 154(b) by 461 days.

(21) Appl. No.: 11/258,242

(22) Filed: Oct. 26, 2005

(65) Prior Publication Data
US 2006/0087821 A1    Apr. 27, 2006

(30) Foreign Application Priority Data

Oct. 26, 2004   (JP)   ............................ 2004-311332
Sep. 7, 2005    (JP)   ............................ 2005-259700

(51) Int. Cl.
*H01H 47/00*    (2006.01)
(52) U.S. Cl. ...................................... 361/212; 361/220
(58) Field of Classification Search ............... 361/212, 361/220, 780, 782, 777; 257/737, 772, 777, 257/778
See application file for complete search history.

(56) References Cited

U.S. PATENT DOCUMENTS

| | | | |
|---|---|---|---|
| 4,586,105 A | 4/1986 | Lippmann et al. | |
| 5,029,041 A * | 7/1991 | Robinson et al. | 361/220 |
| 5,656,530 A * | 8/1997 | Leary | 438/639 |
| 6,510,034 B2 * | 1/2003 | Palinkas et al. | 361/119 |
| 6,559,729 B2 * | 5/2003 | Goma et al. | 331/99 |
| 7,224,052 B2 * | 5/2007 | Nishizawa et al. | 257/679 |

FOREIGN PATENT DOCUMENTS

| | | |
|---|---|---|
| JP | 2-68468 | 5/1990 |
| JP | 2000-323800 | 11/2000 |
| JP | 2001-7455 | 1/2001 |

* cited by examiner

*Primary Examiner*—Danny Nguyen
(74) *Attorney, Agent, or Firm*—Nixon & Vanderhye P.C.

(57) ABSTRACT

A circuit board includes: an input terminal for inputting a signal from an external circuit; a first land and a second land; and an electrostatic-charge absorbing conductor for absorbing an electrostatic charge. The first land is electrically connected to the input terminal. The second land is separated from the first land by a predetermined distance therebetween. A distance between the electrostatic-charge absorbing conductor and the first land is shorter than a distance between the first land and the second land. In the circuit board, the electrostatic charge is effectively absorbed into the electrostatic-charge absorbing conductor through the first land so that the electrostatic charge is prevented from negatively affecting on electric parts on the board.

38 Claims, 4 Drawing Sheets

| SIZE OF MOUNTED PARTS [mm] | L2 [mm] | +POLARITY [kV] | −POLARITY [kV] |
|---|---|---|---|
| 1.6×0.8 | 0.8 | 2 | 2 |
| 2.0×1.25 | 1.0 | 2.3 | 2.5 |
| 3.2×1.6 | 2.2 | 4.2 | 5 |
| 4.5×3.2 | 3.4 | 5.4 | 6.4 |

CIRCUIT BOARD AND ELECTRIC DEVICE HAVING CIRCUIT BOARD

CROSS REFERENCE TO RELATED APPLICATIONS

This application is based on Japanese Patent Applications No. 2004-311332 filed on Oct. 26, 2004, and No. 2005-259700 filed on Sep. 7, 2005, the disclosures of which are incorporated herein by reference.

FIELD OF THE INVENTION

The present invention relates to a circuit board and a semiconductor device having a circuit board.

BACKGROUND OF THE INVENTION

Conventionally, regarding ECU for an automotive vehicle, when a passenger or a driver operates a switch, electrostatic charge may penetrate into the ECU through a wiring harness, so that an IC in the ECU is damaged. Thus, to protect the ECU from the static charge, an electric part such as a resistor is formed on an input side of the ECU. The electric part for the protection of the ECU prevents not only the static charge but also external noise from penetrating into the ECU.

Further, recently, the number of electric parts in the ECU in the vehicle increases, and an accommodation space for the ECU becomes smaller. Thus, it is required to minimize the ECU and to increase the number of electric parts in the ECU.

Furthermore, to improve lifetime of a solder, an electrode is formed on a long side of the electric part in the ECU, instead of a short side of the part. In this case, a distance between electrodes becomes narrower, compared with a case where the electrode is formed on the short side of the part.

Thus, the electric part for the protection of static charge is minimized, and the distance between the electrodes of the parts becomes narrower so that a distance between lands on a circuit board becomes narrower, the lands corresponding to the electrodes. Therefore, conventionally, the electric part such as the resistor can prevent the static charge from penetrating into the IC of the ECU, i.e., the static charge penetrating into the IC is reduced. However, in the above device, since the distance between the lands is short, the static charge transmits between the lands through the protection part so that the static charge is not reduced in the protection part. Thus, the static charge directly penetrates into the IC so that the IC is damaged.

To protect the IC from the above direct transmission of the static charge, Japanese laid-Open Patent Publication No. S62-35480 discloses a circuit board. The circuit board includes the first wiring and the second wiring. The first wiring includes a resistor for limiting current, and formed on a signal input terminal side of a semiconductor circuit package. The second wiring works as a ground, and includes two parts, one of which protrudes and extends in parallel to the first wiring, the other one of which is connected to the semiconductor circuit package. The circuit board includes a protrusion facing the first and the second wirings so that a spark gap is provided. The spark gap is covered with a tape.

In general, a wiring is coated with an insulation film. Accordingly, in the device having the spark gap between the first and the second wirings, the static charge is not absorbed effectively, since the wiring is covered with the insulation film. Thus, the static charge may damage the IC.

SUMMARY OF THE INVENTION

In view of the above-described problem, it is an object of the present invention to provide a circuit board and an electric device having a circuit board.

A circuit board includes: an input terminal for inputting a signal from an external circuit; a first land and a second land; and an electrostatic-charge absorbing conductor for absorbing an electrostatic charge. The first land is electrically connected to the input terminal. The second land is separated from the first land by a predetermined distance therebetween. A distance between the electrostatic-charge absorbing conductor and the first land is shorter than a distance between the first land and the second land.

In the circuit board, the electrostatic charge penetrated from the input terminal is effectively absorbed into the electrostatic-charge absorbing conductor through the first land so that the electrostatic charge is prevented from negatively affecting on electric parts on the circuit board.

Alternatively, the circuit board may further include a first electric part disposed on the first land. The first electric part is an electrostatic charge reducing element for reducing the electrostatic charge. Alternatively, the first land may include a first electric field concentration portion, at which an electric filed is concentrated, and the electrostatic-charge absorbing conductor is disposed near the first electric field concentration portion of the first land. Alternatively, the electrostatic-charge absorbing conductor may include a second electric field concentration portion, at which an electric filed is concentrated. The second electric field concentration portion of the electrostatic-charge absorbing conductor faces or is disposed near the first electric field concentration portion of the first land.

Alternatively, the electrostatic-charge absorbing conductor may be disposed between the first land and the second land, or disposed under the first electric part.

Alternatively, the circuit board may further include: a substrate having a first plane and a second plane; and an electrode. The first electric part is disposed on the first plane of the substrate. The electrode is disposed on the second plane of the substrate. The electrostatic-charge absorbing conductor is a via conductor in a via hole of the substrate. The via conductor is disposed on the first plane of the substrate, and electrically connected to the electrode on the second plane of the substrate.

Alternatively, the second land may be electrically connected to a ground through a capacitor. The circuit board may further include: a third land electrically connected to the first land and the input terminal; a second electric part disposed on the third land; and a fourth land separated from the third land by a predetermined distance, and connected to the ground. A distance between the third land and the fourth land is shorter than the distance between the first land and the second land.

Further, an electric device includes: a circuit board including an input terminal for inputting a signal from an external circuit; a first land disposed on the circuit board and electrically connected to the input terminal; a second land disposed on the circuit board and separated from the first land by a predetermined distance; a first electric part mounted between the first land and the second land; an input circuit element electrically connected to the second land and disposed on the circuit board; and an electrostatic-charge absorbing conductor disposed on the circuit board for absorbing an electrostatic charge. A distance between the electrostatic-charge absorbing conductor and the first land is shorter than a distance between the first land and the second land.

In the device, the electrostatic charge penetrated from the input terminal is effectively absorbed into the electrostatic-charge absorbing conductor through the first land so that the electrostatic charge is prevented from negatively affecting on electric parts on the circuit board.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
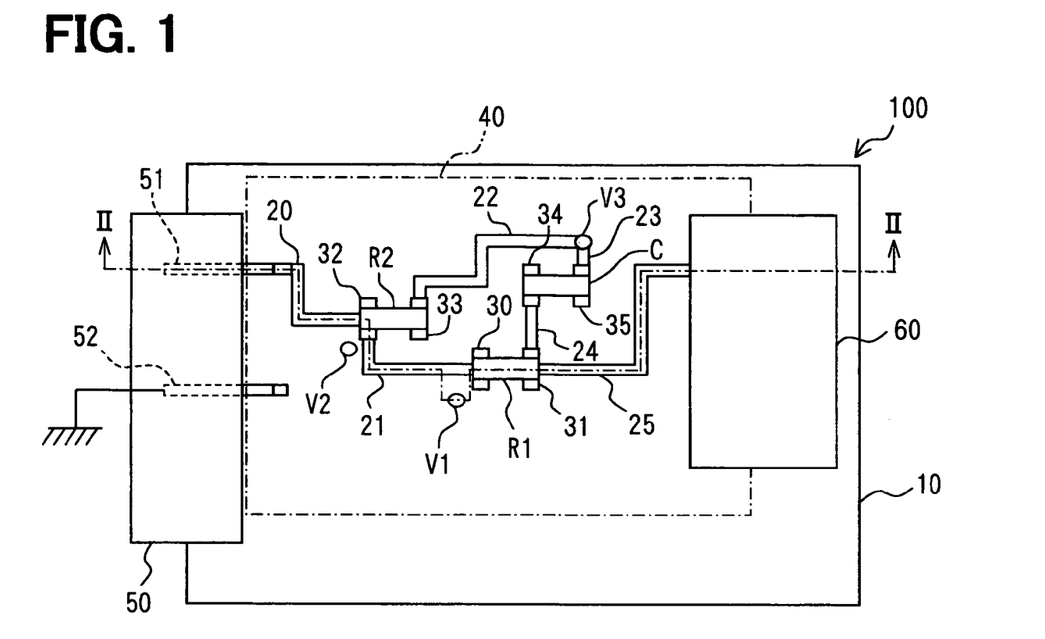
FIG. 1 is a plan view showing an electric device according to a first embodiment of the present invention.
Figure 2:
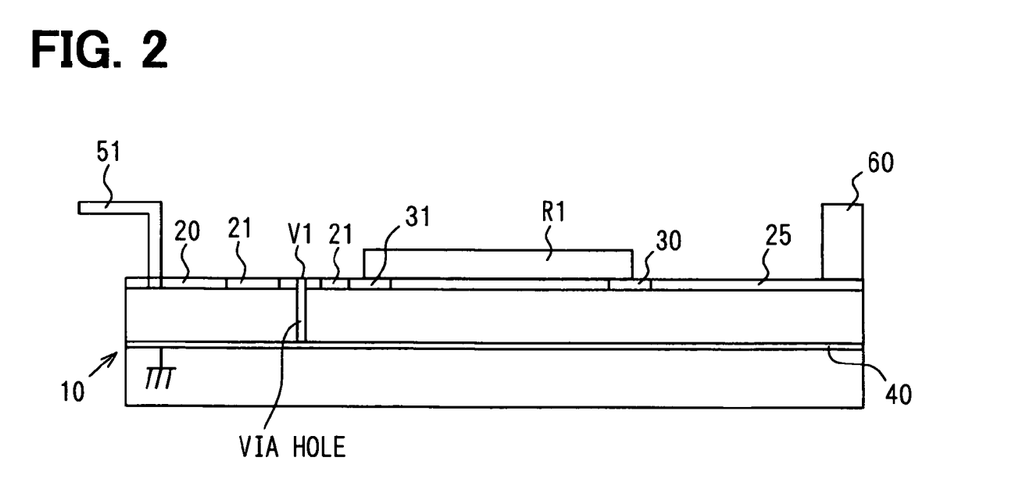
FIG. 2 is a cross sectional view showing the device taken along line II-II in FIG. 1.
Figure 3:
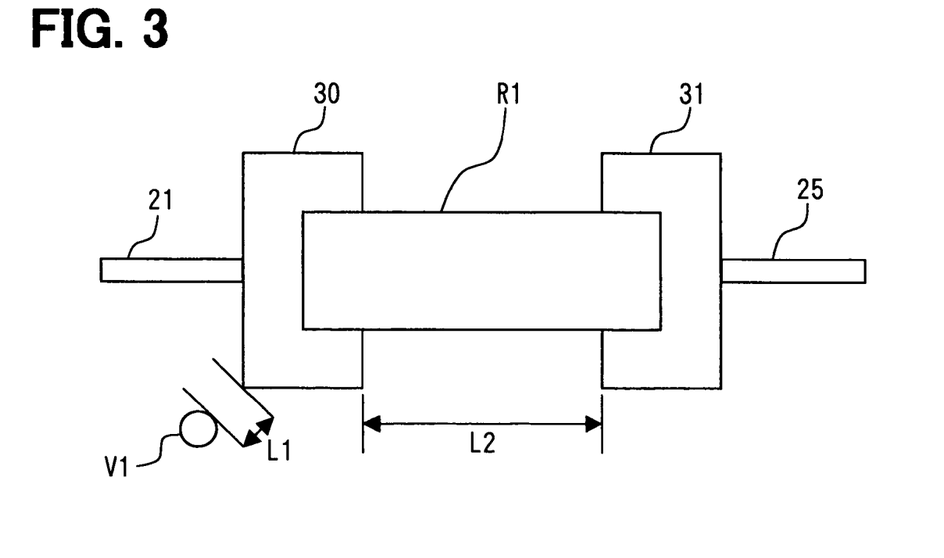
FIG. 3 is a plan view explaining a relationship between a via conductor and a land in the device according to the first embodiment.
Figure 4A:
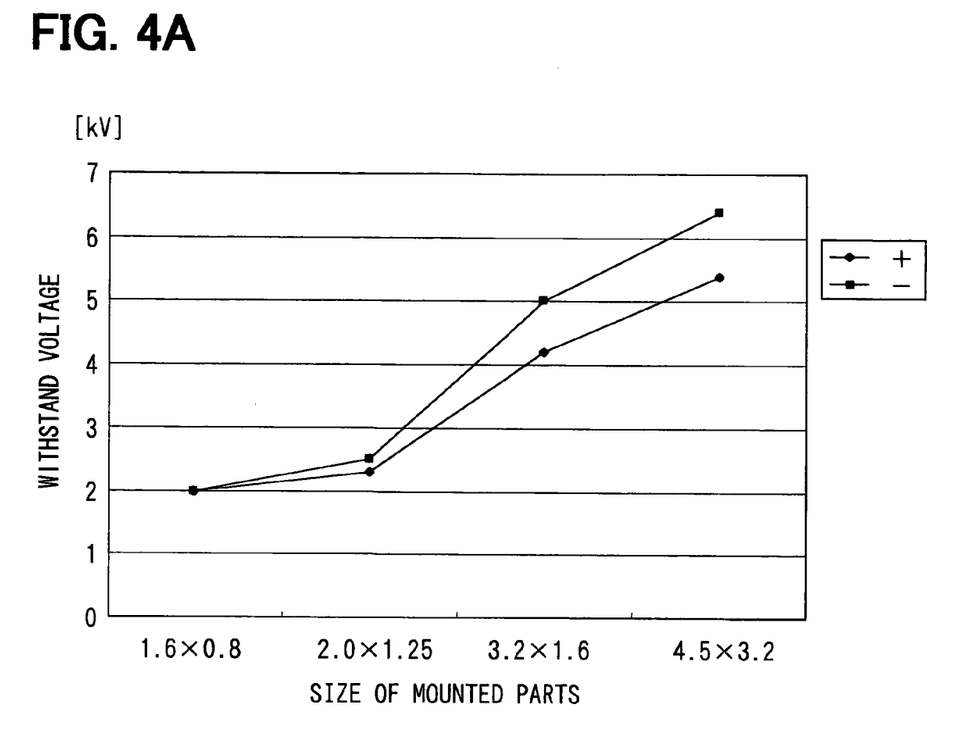
FIG. 4A is a graph showing a relationship between size of mounted parts and an electrostatic withstand voltage.
Figure 4B:
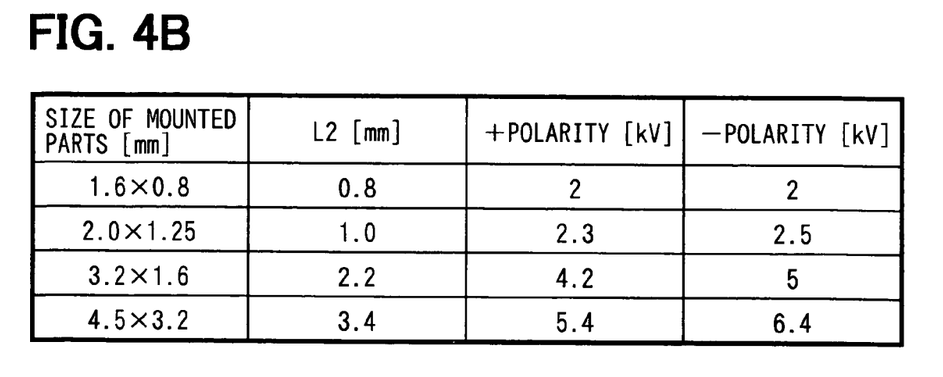
FIG. 4B is a table explaining the relationship between the size of the mounted parts and the electrostatic withstand voltage, according to the first embodiment.

An electric device 100 according to a first embodiment of the present invention is shown in FIGS. 1 and 2. FIG. 3 shows a relationship between a via conductor and a land in the device 100. FIG. 4 shows a relationship between a distance between the lands and erector-static withstand voltage. The device 100 includes a circuit board 10, which is a multi-layered circuit board composed of multiple sheets made of dielectric material. A conductive pattern is formed on the sheets. The circuit board 10 includes first to sixth wirings 20-25, first to sixth lands 30-35, an inner layer ground pattern 40, and first to third via conductors V1-V3. On the circuit board 10, a connector 50, an input IC 60 for inputting an electric signal, first and second resistors R1, R2, and a capacitor C are mounted. Although the circuit board 10 is formed of a binary-layered circuit board, the circuit board 10 may be formed of other multi-layered circuit board such as a ternary-layered circuit board.

The first wiring 20 electrically connects between an input terminal 51 and the third land 32, the second wiring 21 electrically connects between the third land 32 and the first land 30, the third wiring 22 electrically connects between the fourth land 33 and the third via conductor V3, the fourth wiring 23 electrically connects between the third via conductor V3 and the sixth land 35, the fifth wiring 24 electrically connects between the fifth land 34 and the second land 31, the sixth wiring 25 electrically connects between the second land 31 and the input IC 60. Each wiring 20-25 other than a connection portion for connecting to a terminal or a land is covered with an insulation film.

The first and the second resistors R1, R2 and the capacitor C are mounted on the first to sixth lands 30-35. Each land 30-35 is not covered with an insulation film so that the conductor of the land 30-35 is exposed outside. This is because the first and the second resistors R1, R2 and the capacitor C are electrically bonded to the land 30-35 with a solder. Here, each wiring 20-25 is covered with the insulation film.

The inner layer ground pattern 40 is formed on a sheet made of dielectric material and composing the circuit board 10. The inner layer ground pattern 40 is formed inside of the circuit board 10. The inner layer ground pattern 40 is connected to the first to third via conductors V1-V3 and a ground terminal 52 through via holes. The first to third via conductors V1-V3 correspond to an electrostatic-charge absorbing conductor.

The connector 50 connects electrically between an external circuit and the device 100. The connector 50 includes the input terminal 50 and the ground terminal 52. The input IC 60 includes an AD converter for converting an analog signal to a digital signal so that the input IC 60 processes an input signal.

The first resistor R1 and the capacitor C provide RC filter for protecting a noise from penetrating into the device 100. The electrostatic charge penetrating from the input terminal 51 is reduced by the RC filter. The first resistor R1 corresponds to an electrostatic-charge reducing device. The second resistor R2 works in a case where the signal is not inputted into the input terminal 51. Further, the second resistor R2 is a pull-down resistor for fixing electric potential of a ground state so that the input IC 60 is connected to a ground potential. Although the device 100 includes the second resistor R2 as the pull-down resistor, the device may not include the pull-down resistor.

A first distance between the first via conductor V1 and the first land 30 is defined as L1, and a second distance between the first and the second lands 30, 31 is defined as L2, as shown in FIG. 3. The relationship between the first distance L1 and the second distance L2 is explained as follows. Here, a relationship between a distance between the second via conductor V2 and the third land 32 and another distance between the third land 32 and the fourth land 33 is similar to the relationship between the first distance L1 and the second distance L2.

The electrostatic charge inputted from the input terminal 51 transmits to the first land 30 through the first wiring 21. The static charge is reduced by the first resistor R1 mounted between the first land 30 and the second land 31. However, when the dimensions of the first resistor R1 are small, for example, equal to or smaller than 2.0 mm×1.25 mm, the second distance L2 between the first and the second lands 30, 31 becomes short. In general, the electrostatic charge easily discharges as a distance between conductors becomes smaller. Thus, when the second distance L2 becomes shorter, the static charge may easily discharge between the first and the second lands 30, 31. In this case, the electrostatic charge transmits to the input IC 60 through the first and the second lands 30, 31 without reducing at the first resistor R1. Further, when the first resistor R1 is small, the withstand energy of the first resistor R1 is small. Accordingly, when the large static charge flows through the first resistor R1, the first resistor R1 may be broken down.

Specifically, as shown in FIG. 4, when the dimensions of the circuit board 10 are 4.5 mm×3.2 mm, the second distance L2 is about 3.4 mm. In this case, the voltage of the electric discharge between the first land 30 and the second land 31 without reducing the electrostatic charge (i.e., the withstand voltage) is about 5.4 kV in case of positive polarity, or 6.4 kV in case of negative polarity. Accordingly, when the voltage is equal to or smaller than 5.4 kV in case of positive polarity and 6.4 kV in case of negative polarity, the electrostatic charge can be reduced by the first resistor R1.

When the dimensions of the circuit board 10 are 3.2 mm×1.6 mm, the second distance L2 is about 2.2 mm. In this case, the voltage of the electric discharge between the first land 30 and the second land 31 without reducing the electrostatic charge is about 4.2 kV in case of positive polarity, or 5.0 kV in case of negative polarity. Accordingly, when the voltage is equal to or smaller than 4.2 kV in case of positive polarity and 5.0 kV in case of negative polarity, the electrostatic charge can be reduced by the first resistor R1.

When the dimensions of the circuit board 10 are 2.0 mm×1.25 mm, the second distance L2 is about 11.0 mm. In this case, the voltage of the electric discharge between the first land 30 and the second land 31 without reducing the electrostatic charge is about 2.3 kV in case of positive polarity, or 2.5 kV in case of negative polarity. Accordingly, when the voltage is equal to or smaller than 2.3 kV in case of positive polarity and 2.5 kV in case of negative polarity, the electrostatic charge can be reduced by the first resistor R1.

When the dimensions of the circuit board 10 are 1.6 mm×0.8 mm, the second distance L2 is about 0.8 mm. In this case, the voltage of the electric discharge between the first land 30 and the second land 31 without reducing the electrostatic charge is about 2.0 kV in case of positive polarity, or 2.0 kV in case of negative polarity. Accordingly, when the voltage is equal to or smaller than 2.0 kV in case of positive polarity and 2.0 kV in case of negative polarity, the electrostatic charge can be reduced by the first resistor R1.

As the dimensions of the circuit board 10 become smaller, the second distance L2 becomes small. Thus, the voltage of the electric discharge between the first land 30 and the second land 31 without reducing the electrostatic charge becomes smaller. Therefore, to prevent the static charge from penetrating into the input IC 60 from the first land 30 without passing through the first resistor R1, and to protect the first resistor R1 over the static charge from directly passing through the first resistor R1, the first via conductor V1 as electrostatic-charge absorbing conductor is formed near the first land 30. Here, the first distance L1 between the first land 30 and the first via conductor V1 is smaller than the second distance L2 between the second land 31 and the first via conductor V1.

In the above case, since the first distance L1 is smaller than the second distance L2, the electrostatic charge inputted from the input terminal 51 may easily discharge between the first land 30 and the first via conductor V1. The first via conductor V1 is electrically connected to the inner layer ground pattern 40. Accordingly, the electrostatic charge flows into the ground through the first via conductor V1. Thus, the static charge is safely removed.

Preferably, the first via conductor V1 is disposed near a portion, at which electric field is concentrated. The portion at which the electric field is concentrated is, for example, a corner of the first land 30. Since inequality electric field is formed at the corner of the first land 30 when the electrostatic charge is applied to the first land 30, the electric field is concentrated at the corner. Thus, the discharge of the electrostatic charge may easily occur at the corner of the first land 30. Accordingly, it is preferred that the first via conductor V1 is disposed near the corner of the first land 30. In this case, the discharge of the electrostatic charge is easily occurred between the first land 30 and the first via conductor V1, so that the electrostatic charge is much prevented from penetrating into the input IC 60.

Alternatively, the first via conductor V1 may be disposed on a portion facing the corner of the first land 30, as shown in FIG. 3. The portion facing the corner of the first land 30 is the nearest position so that the corner of the first land 30 is nearest portion of the first land 30 when a distance between the first via conductor V1 and the first land 30 is determined. The electric field concentration is easily occurred in a direction facing the corner of the first land 30, so that the discharge of the electrostatic charge is easily occurred between the first land 30 and the first via conductor V1. Thus, the first via conductor V1 as the electrostatic-charge absorbing conductor easily absorbs the electrostatic charge.

More preferably, the corner of the first land 30 is sharpened so that the inequality electric field is easily formed at the sharpened corner of the first land 30 when the electric field is applied to the first land 30. Thus, the electric field is concentrated at the sharpened corner, so that the discharge of the electrostatic charge is easily occurred at the sharpened corner.

The electrostatic-charge absorbing conductor, i.e., the first via conductors V1, may be disposed on a portion between lands, for example, the portion between the first and the second lands 30, 31, on which a circuit part such as the first resistor R1 is mounted. In this case, the substrate area of the circuit board 10 can be effectively utilized.

Further, the electrostatic-charge absorbing conductor, i.e., the first via conductors V1, may be disposed under the circuit part such as the first resistor R1. In this case, the substrate area of the circuit board 10 can be effectively utilized.

Further, the device 100 includes one electrostatic-charge absorbing conductor, i.e., the first via conductors V1, the device 100 may include multiple electrostatic-charge absorbing conductors. In this case, when the electrostatic charge is inputted, the charge can discharge to multiple conductors, so that the charge is easily absorbed in the electrostatic-charge absorbing conductors.

The first distance L1 between the first via conductor V1 and the first land 30 is shortened as small as possible without providing a problem of arrangement of the circuit board 10 or the like. When first via conductor V1 is approximated to the first land 30, failure of the circuit board 10 such as short-circuiting between the first land 30 and the first via conductor V1 through moisture in air may occur. Accordingly, it is preferred that the first distance L1 between the first via conductor V1 and the first land 30 is shortened as small as possible without raising the failure of the circuit board 10. Specifically, when the dimensions of the circuit board 10 are 2.0 mm×1.25 mm, the first distance L1 is set to be 0.5 mm so that the electrostatic charge is effectively absorbed in the first via conductor V1. This is because the second distance L2 between the first land 30 and the second land 31 is about 1.0 mm, which is longer than the first distance L1. Further, in this case, the first land 30 is not electrically connected to the first via conductor V1 through moisture or the like. When the first distance L1 is equal to or larger than 0.25 mm, the first land 30 is not electrically connected to the first via conductor V1 through moisture or the like.

Although the device 100 includes the inner layer ground pattern 40 connecting to the first and the second via conductors V1, V2 as the electrostatic-charge absorbing conductor, the device 100 may include a power source pattern formed in an inner layer of the circuit board 10 or a conductive pattern connecting to a load, which is not deteriorated by the electrostatic charge substantially.

Second Embodiment

Figure 5:
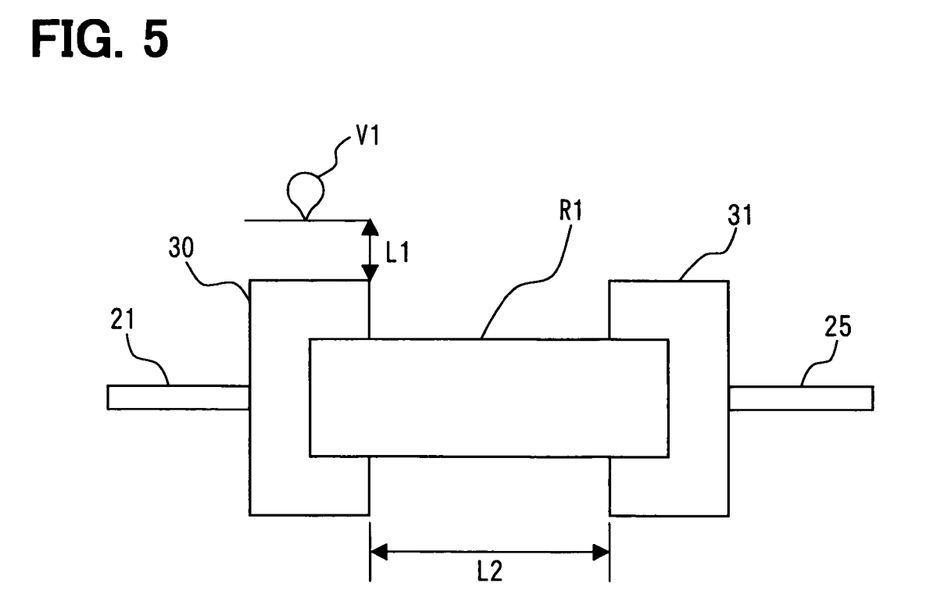
FIG. 5 is a plan view explaining a relationship between a via conductor and a land in an electric device according to a second embodiment of the present invention.

FIG. 5 shows a relationship between the first via conductor V1 and the first land 30, according to a second embodiment of the present invention. The shape of the first via conductor V1 is different from that in FIG. 3.

When it is difficult to form the first via conductor V1 at a portion facing the corner of the first land 30, a sharp tip portion is formed on the first via conductor V1 so that the electric field is concentrated at the sharp tip portion of the first via conductor V1. The first distance L1 between the first land 30 and the first via conductor V1 is set to be shorter than the second distance L2 between the first and the second lands 30, 31. Here, the shape of the first via conductor V1 having the sharp tip portion is a tear drop shape.

In this case, when the electrostatic charge is applied to the first land 30, the discharge of the static charge easily occurs between the first land 30 and the portion of the first via conductor V1, at which the electric field is easily concentrated. Accordingly, since the portion, at which the electric field is easily concentrated, is formed on the first via conductor V1, the electrostatic charge is prevented from penetrating into the input IC 60, so that the device is protected from the electrostatic charge.

Preferably, the position of the first via conductor V1 is near the portion of the first land 30 such as the corner of the first land 30, at which the electric field is concentrated.

Although the shape of the first via conductor V1 is the tear drop shape, the shape of the first via conductor V1 may be another shape as long as the electric field is concentrated at a part of the first via conductor V1. For example, the first via conductor V1 may include a part having a right angle.

Third Embodiment

Figure 6:
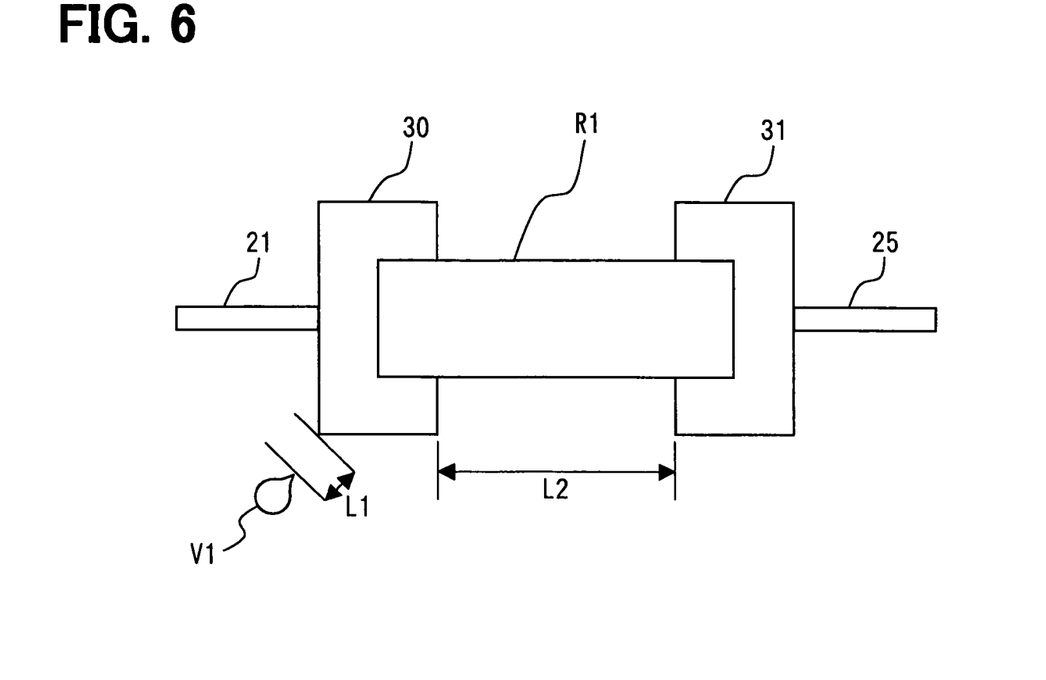
FIG. 6 is a plan view explaining a relationship between a via conductor and a land in an electric device according to a third embodiment of the present invention.

FIG. 6 shows a relationship between the first via conductor V1 and the first land 30, according to a third embodiment of the present invention. The shape of the first via conductor V1 is different from that in FIG. 3. As shown in FIG. 6, the first via conductor V1 includes a sharp tip portion as an electric field concentration portion. The first land 30 includes a corner as the electric field concentration portion. The first distance L1 between the first land 30 and the first via conductor V1 is shorter than the second distance L2 between the first and the second lands 30, 31. The electric field concentration portion of the first via conductor V1 faces the electric field concentration portion of the first land 30, i.e., the sharp tip portion of the first via conductor V1 faces the corner of the first land 30.

In this case, the electrostatic charge is effectively absorbed in the first via conductor V1 as the electrostatic-charge absorbing conductor.

Fourth Embodiment

Figure 7:
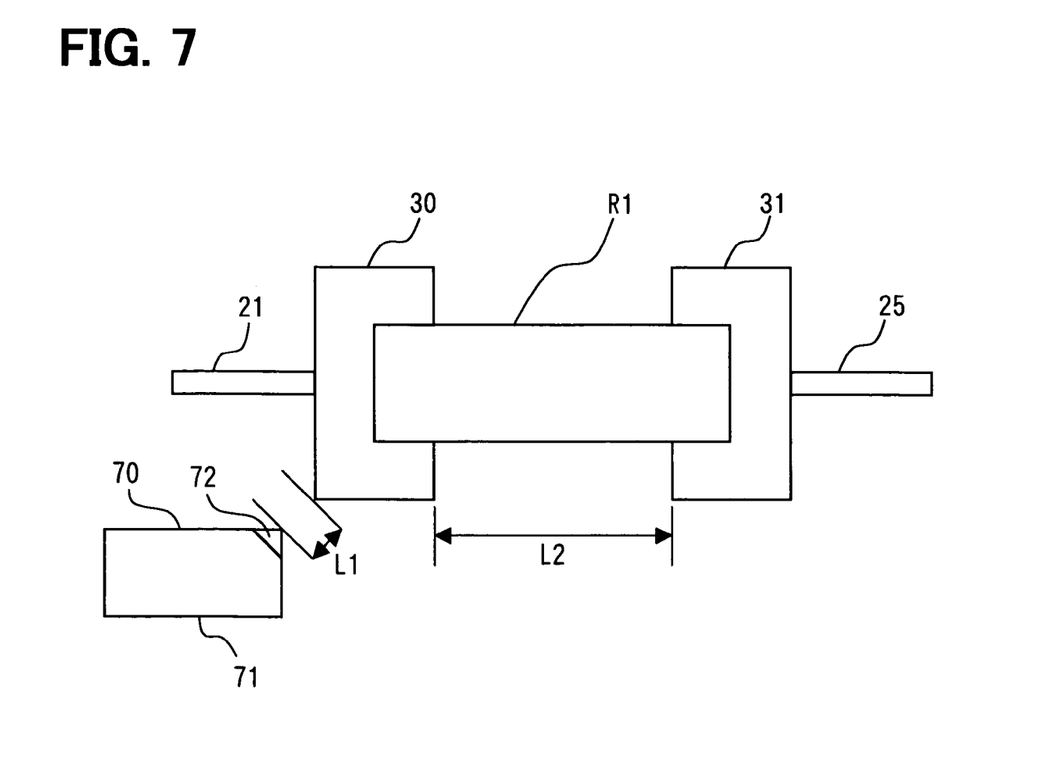
FIG. 7 is a plan view explaining a relationship between a via conductor and a land in an electric device according to a fourth embodiment of the present invention.

FIG. 7 shows a relationship between the first via conductor V1 and a surface layer ground pattern 70, according to a fourth embodiment of the present invention.

The surface layer ground pattern 70 includes an exposed portion 72 as the electrostatic-charge absorbing conductor.

When the surface layer ground pattern 70 is formed on a side of the circuit board 10, on which the first land 30 is disposed, the surface layer ground pattern 70 works as an electrode pattern. A solder resist 71 or the like covers a conductor of the surface layer ground pattern 70. A part of the solder resist 71 is removed so that the exposed portion 72 of the surface layer ground pattern 70 is formed. The first distance L1 between the first land 30 and the exposed portion 72 of the surface layer ground pattern 70 is set to be shorter than the second distance L2 between the first and the second lands 30, 31.

Thus, by using the part of the surface layer ground pattern 70, i.e., the exposed portion 72, the electrostatic charge discharges between the first land 30 and the exposed portion 72 when the electrostatic charge is inputted from the input terminal 51. Accordingly, even when the electrostatic charge is inputted from the input terminal 51, the electrostatic charge is effectively reduced. Preferably, the exposed portion 72 is disposed near the portion, at which the electric field is concentrated, such as the corner of the first land 30. Further, the exposed portion 72 is disposed on a portion facing the corner of the first land 30, at which the electric field is concentrated.

Although the exposed portion 72 has a right angle shape, the exposed portion 72 may have another shape such as a sharpened angle shape.

Although the device 100 includes the surface layer ground pattern 70, the device may have other pattern such as a power source pattern formed on the surface of the circuit board 10 and a conductor pattern connecting to a load, to which the electrostatic charge does not substantially affect.

(Modifications)

A distance between the third via conductor V3 and the fourth land 33 may be shorter than the second distance L2 between the first and the second lands 30, 31. Here, the third land 32 is electrically connected to the input terminal 51, and the fourth land is electrically connected to the third via conductor V3. In this case, when the electrostatic charge is inputted from the input terminal 51, the electrostatic charge is absorbed into the first and the second via conductors V1, V2. Further, the electrostatic charge discharges between the third land 32 and the fourth land 33 so that the static charge is absorbed into the third via conductor V3. Accordingly, the device 100 is protected from the discharge of the electrostatic charge effectively.

Although the device 100 includes the resistor R1, R2 for reducing the electrostatic charge, the device may have other elements such as a capacitor and a coil for reducing the electrostatic charge.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A circuit board comprising:
   an input terminal for inputting a signal from an external circuit;
   a first land and a second land;
   an electrostatic-charge absorbing conductor for absorbing an electrostatic charge; and
   a first electric part, wherein
   the first land is electrically connected to the input terminal but is not electrically connected to the electrostatic-charge absorbing conductor by a conductor,
   the second land is separated from the first land by a predetermined distance therebetween, a distance between the electrostatic-charge absorbing conductor and the first land is shorter than a distance between the first land and the second land, and the first electric part is mounted between the first land and the second land so that the first and second lands provide a pair for mounting the first electric part.

2. The circuit board according to claim 1, wherein the first electric part is an electrostatic charge reducing element for reducing the electrostatic charge.

3. The circuit board according to claim 2, wherein the electrostatic charge reducing element is a resistor, a capacitor, or a coil.

4. The circuit board according to claim 1, wherein the first land includes a first electric field concentration portion, at which an electric filed is concentrated, and the electrostatic-charge absorbing conductor is disposed near the first electric field concentration portion of the first land.

5. The circuit board according to claim 4, wherein the first electric field concentration portion of the first land is a first corner of the first land.

6. The circuit board according to claim 5, wherein the electrostatic-charge absorbing conductor faces the first corner of the first land.

7. The circuit board according to claim 5, wherein the first corner of the first land has a sharp angle.

8. The circuit board according to claim 4, wherein the electrostatic-charge absorbing conductor includes a second electric field concentration portion, at which an electric filed is concentrated.

9. The circuit board according to claim 8, wherein the second electric field concentration portion of the electrostatic-charge absorbing conductor is disposed near the first electric field concentration portion of the first land.

10. The circuit board according to claim 8, wherein the second electric field concentration portion of the electrostatic-charge absorbing conductor faces the first electric field concentration portion of the first land.

11. The circuit board according to claim 8, wherein the second electric field concentration portion of the electrostatic-charge absorbing conductor is a second corner.

12. The circuit board according to claim 11, wherein the second corner of the electrostatic-charge absorbing conductor has a sharp angle.

13. The circuit board according to claim 1, wherein the electrostatic-charge absorbing conductor is disposed between the first land and the second land.

14. The circuit board according to claim 2, wherein the electrostatic-charge absorbing conductor is disposed under the first electric part.

15. The circuit board according to claim 1, further comprising: a plurality of electrostatic-charge absorbing conductors for absorbing the electrostatic charge.

16. A circuit board comprising:
an input terminal for inputting a signal from an external circuit;
a first land and a second land;
an electrostatic-charge absorbing conductor for absorbing an electrostatic charge;
a first electric part disposed on the first land;
a substrate having a first plane and a second plane; and
an electrode, wherein
the first land is electrically connected to the input terminal,
the second land is separated from the first land by a predetermined distance therebetween,
a distance between the electrostatic-charge absorbing conductor and the first land is shorter than a distance between the first land and the second land, the first electric part is an electrostatic charge reducing element for reducing the electrostatic charge,
the first electric part is disposed on the first plane of the substrate,
the electrode is disposed on the second plane of the substrate,
the electrostatic-charge absorbing conductor is a via conductor in a via hole of the substrate, and
the via conductor is disposed on the first plane of the substrate, and electrically connected to the electrode on the second plane of the substrate.

17. The circuit board according to claim 2, further comprising: a substrate having a surface, wherein the first electric part is disposed on the surface of the substrate, and the electrostatic-charge absorbing conductor is an exposed portion of an electrode pattern disposed on the surface of the substrate.

18. The circuit board according to claim 1, wherein the second land is electrically connected to a ground through a capacitor.

19. The circuit board according to claim 18, further comprising: a third land electrically connected to the first land and the input terminal; a second electric part disposed on the third land; and a fourth land separated from the third land by a predetermined distance, and connected to the ground, wherein a distance between the third land and the fourth land is shorter than the distance between the first land and the second land.

20. An electric device comprising:
a circuit board including an input terminal for inputting a signal from an external circuit;
a first land disposed on the circuit board and electrically connected to the input terminal;
a second land disposed on the circuit board and separated from the first land by a predetermined distance;
a first electric part;
an input circuit element electrically connected to the second land and disposed on the circuit board; and
an electrostatic-charge absorbing conductor disposed on the circuit board for absorbing an electrostatic charge and not being electrically connected to the first land by a conductor, wherein
a distance between the electrostatic-charge absorbing conductor and the first land is shorter than a distance between the first land and the second land, and
the first electric part is mounted between the first land and the second land so that the first and second lands provide a pair for mounting the first electric part.

21. The device according to claim 20, wherein the first electric part is an electrostatic charge reducing element for reducing the electrostatic charge.

22. The device according to claim 21, wherein the electrostatic charge reducing element is a resistor, a capacitor, or a coil.

23. The device according to claim 20, wherein the first land includes a first electric field concentration portion, at which an electric filed is concentrated, and the electrostatic-charge absorbing conductor is disposed near the first electric field concentration portion of the first land.

24. The device according to claim 23, wherein the first electric field concentration portion of the first land is a first corner of the first land.

25. The device according to claim 24, wherein the electrostatic-charge absorbing conductor faces the first corner of the first land.

26. The device according to claim 24, wherein the first corner of the first land has a sharp angle.

27. The device according to claim 23, wherein the electrostatic-charge absorbing conductor includes a second electric field concentration portion, at which an electric filed is concentrated.

28. The device according to claim 27, wherein the second electric field concentration portion of the electrostatic-charge absorbing conductor is disposed near the first electric field concentration portion of the first land.

29. The device according to claim 27, wherein the second electric field concentration portion of the electrostatic-charge absorbing conductor faces the first electric field concentration portion of the first land.

30. The device according to claim 27, wherein the second electric field concentration portion of the electrostatic-charge absorbing conductor is a second corner of the electrostatic-charge absorbing conductor.

31. The device according to claim 30, wherein the second corner of the electrostatic-charge absorbing conductor has a sharp angle.

32. The device according to claim 20, wherein the electrostatic-charge absorbing conductor is disposed between the first land and the second land.

33. The device according to claim 20, wherein the electrostatic-charge absorbing conductor is disposed under the first electric part.

34. The device according to claim 20, further comprising: a plurality of electrostatic-charge absorbing conductors for absorbing the electrostatic charge.

35. An electric device comprising:
a circuit board including an input terminal for inputting a signal from an external circuit;
a first land disposed on the circuit board and electrically connected to the input terminal;
a second land disposed on the circuit board and separated from the first land by a predetermined distance;
a first electric part mounted between the first land and the second land;
an input circuit element electrically connected to the second land and disposed on the circuit board; and
an electrostatic-charge absorbing conductor disposed on the circuit board for absorbing an electrostatic charge, wherein
a distance between the electrostatic-charge absorbing conductor and the first land is shorter than a distance between the first land and the second land,
the circuit board includes a first plane and a second plane,
the first electric part is disposed on the first plane of the circuit board,
the circuit board further includes an electrode, which is disposed on the second plane of the circuit board,
the electrostatic-charge absorbing conductor is a via conductor in a via hole of the circuit board, and
the via conductor is disposed on the first plane of the circuit board, and electrically connected to the electrode on the second plane.

36. The device according to claim 20, wherein the electrostatic-charge absorbing conductor is an exposed portion of an electrode pattern disposed on a side of the circuit board, the side on which the first electric part is disposed.

37. The device according to claim 20, wherein the second land is electrically connected to a ground through a capacitor.

38. The device according to claim 37, further comprising: a third land electrically connected to the first land and the input terminal; a second electric part disposed on the third land; and a fourth land separated from the third land by a predetermined distance, and connected to the ground, wherein a distance between the third land and the fourth land is shorter than the distance between the first land and the second land.

* * * * *